(12) United States Patent
Sung et al.

(10) Patent No.: US 10,797,720 B2
(45) Date of Patent: Oct. 6, 2020

(54) APPARATUS AND METHOD FOR MEASURING CURRENT SOURCE MISMATCHES IN CURRENT-STEERING DAC BY RE-USING R2R NETWORK

(71) Applicant: QUALCOMM Incorporated, San Diego, CA (US)

(72) Inventors: Eunyung Sung, San Diego, CA (US); Nitz Saputra, Burlingame, CA (US); Behnam Sedighi, La Jolla, CA (US); Ashok Swaminathan, Cardiff, CA (US); Honghao Ji, San Diego, CA (US); Shahin Mehdizad Taleie, San Diego, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/367,712

(22) Filed: Mar. 28, 2019

(65) Prior Publication Data

US 2020/0099389 A1    Mar. 26, 2020

Related U.S. Application Data

(60) Provisional application No. 62/734,928, filed on Sep. 21, 2018.

(51) Int. Cl.
    *H03M 1/74*     (2006.01)
    *H03M 1/78*     (2006.01)
    *H03M 1/68*     (2006.01)

(52) U.S. Cl.
    CPC ............ *H03M 1/745* (2013.01); *H03M 1/687* (2013.01); *H03M 1/747* (2013.01); *H03M 1/785* (2013.01)

(58) Field of Classification Search
    USPC .......................................................... 341/145
    See application file for complete search history.

(56) References Cited

U.S. PATENT DOCUMENTS

| | | | |
|---|---|---|---|
| 7,076,384 B1 * | 7/2006 | Radulov .............. | H03M 1/1057 324/601 |
| 9,819,357 B1 * | 11/2017 | Guo ..................... | H03M 1/0607 |
| 2003/0001765 A1 * | 1/2003 | Bright ................. | H03M 1/0604 341/145 |

(Continued)

OTHER PUBLICATIONS

Bechthum et al., A Novel Temperature and Disturbance Insensitive DAC Calibration Method, IEEE International Symposium of Circuits and Systems (ISCAS) Conference Date May 2011, IEEE Xplore Jul. 2011 (Year: 2011).*

(Continued)

*Primary Examiner* — Howard Williams
(74) *Attorney, Agent, or Firm* — Loza & Loza, LLP

(57) ABSTRACT

A current digital-to-analog converter includes a binary current-generating section configured to generate a binary-weighted current based on a first set of control signals; a unary current-generating section configured to generate a unary-weighted current based on a second set of control signals; and a current combining circuit configured to add or subtract a reference current and a current generated by a current source of the unary current-generating section using the binary-weighted current.

35 Claims, 6 Drawing Sheets

(56) References Cited

U.S. PATENT DOCUMENTS

2009/0051576 A1* 2/2009 Dedic .............. H03K 17/04123
341/136

OTHER PUBLICATIONS

Virtanen et al., A 12-bit Current-Steering DAC with Calibration by Combination Selection, IEEE 2007 International Symposium on Circuits and Systems, Conference date May 2007, Xplore date Jun. 2007 (Year: 2007).*

McDonnell et al., Compensation and Calibration Techniques for Current-Steering DACs, IEEE Circuits and Systems Magazine, May 2017 pp. 4-26 (Year: 2017).*

K. Virtanen, J. Maunu, J. Poikonen and A. Paasio, "A 12-bit Current-Steering DAC with Calibration by Combination Selection," 2007 IEEE International Symposium on Circuits and Systems, New Orleans, LA, 2007, pp. 1469-1472, doi: 10.1109/ISCAS.2007.378580. (Year: 2007).*

J. Maunu, M. Pankaala, J. Marku, J. Poikonen, M. Laiho and A. Paasio, "Current source calibration by combination selection of minimum sized devices," 2006 IEEE International Symposium on Circuits and Systems, Island of Kos, 2006, pp. 4 pp.-552, doi: 10.1109/ISCAS.2006.1692644. (Year: 2006).*

* cited by examiner

APPARATUS AND METHOD FOR MEASURING CURRENT SOURCE MISMATCHES IN CURRENT-STEERING DAC BY RE-USING R2R NETWORK

CROSS-REFERENCE TO RELATED APPLICATION

This application claims the benefit of the filing date of U.S. Provisional Application, Ser. No. 62/734,928, filed on Sep. 21, 2018, which is incorporated herein by reference.

FIELD

Aspects of the present disclosure relate generally to digital-to-analog converters (DACs), and in particular, to an apparatus and method for measuring current source mismatches in current-steering digital-to-analog (DAC) converter by re-using R2R network.

BACKGROUND

A current digital-to-analog converter (DAC) receives an input digital signal and generates an analog output current based on the input digital signal. The current DAC typically employs a set of current sources configured to generate a set of currents based on the input digital signal, respectively. The set of currents are combined to form the output current.

Similarly, a differential or current-steering DAC receives an input digital signal and generates an analog differential output current based on the input digital signal. The current-steering DAC typically also employs a set of current sources configured to generate a set of currents, respectively. The current-steering DAC additionally employs a set of steering switches (e.g., transistors) configured to steer the set of currents to the positive and/or the negative differential output to form the positive and negative current components and the differential output current, respectively. The current steering is based on the input digital signal.

In both the current DAC and current-steering DAC, the set of currents generated by the set of current sources may need to be calibrated so that the output current accurately tracks the input digital signal. Accordingly, this disclosure relates to measuring current mismatches between the various current sources for calibration and/or other purposes.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a first current-generating section configured to generate a first current based on a first set of control signals; a second current-generating section configured to generate a second current based on a second set of control signals; and a current combining circuit configured to add or subtract a reference current and a current generated by a current source of the second current-generating section using the first current.

Another aspect of the disclosure relates to a digital-to-analog converter circuit including a first set of current sources, and one or more resistive networks; a second section comprising a second set of current sources; and a measurement circuit operably coupled to the first second and the second section.

Another aspect of the disclosure relates to a digital-to-analog converter circuit including a first set of current sources, and one or more resistive networks; a second section comprising a second set of current sources; and a measurement circuit configured to measure mismatches between currents generated by the second set of current sources using a current generated by the first set of current sources.

Another aspect of the disclosure relates to a method for measuring current mismatch including generating a first current based on a first set of control signals; generating a second current based on a second set of control signals; and generating an indication of a current mismatch between a reference current and the second current using the first current.

Another aspect of the disclosure relates to an apparatus for measuring current mismatch including means for generating a first current based on a first set of control signals; means for generating a second current based on a second set of control signals; and means for generating an indication of a current mismatch between a reference current and the second current using the first current.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
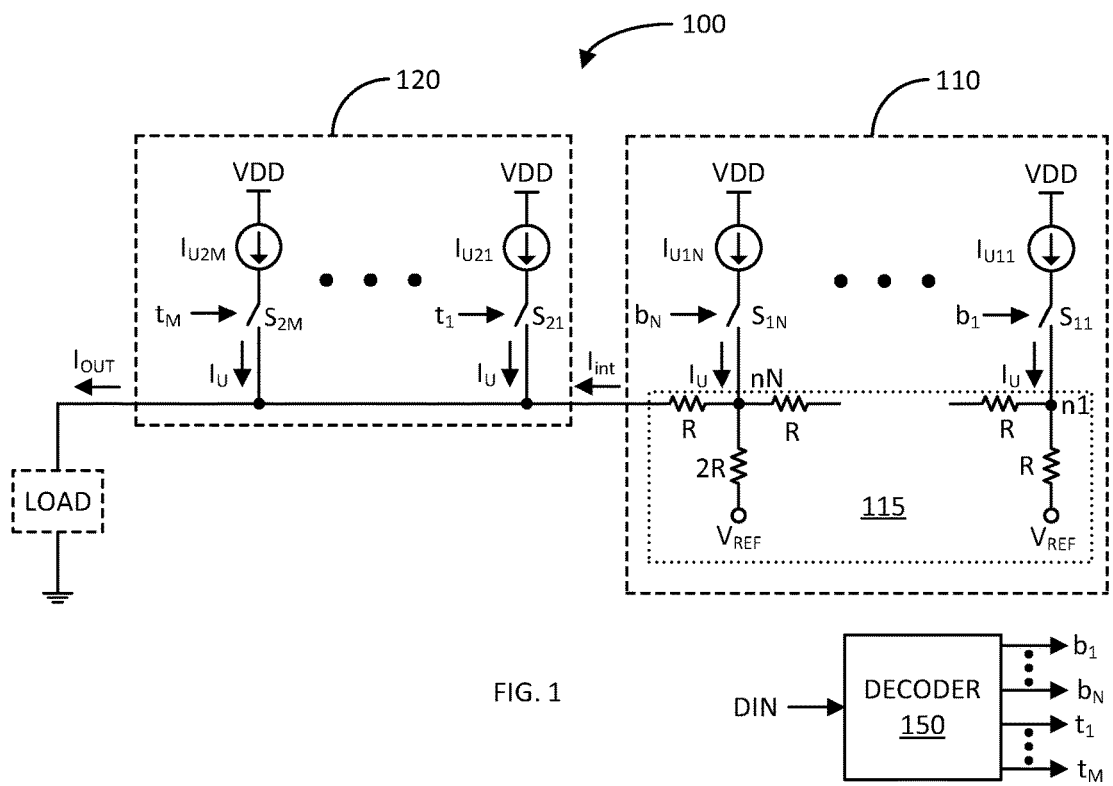
FIG. 1 illustrates a schematic diagram of an exemplary current digital-to-analog converter (DAC) in accordance with an aspect of the disclosure.

FIG. 1 illustrates a schematic diagram of an exemplary current digital-to-analog converter (DAC) 100 in accordance with an aspect of the disclosure. The current DAC 100 receives an input digital signal DIN and generates an analog output current $I_{OUT}$ based on the input digital signal DIN. The output current $I_{OUT}$ may be provided to a load, such as a filter or other device, for processing the analog output current $I_{OUT}$.

The current DAC 100 includes a binary current-generating section 110, a unary current-generating section 120, and a decoder 150. The decoder 150 receives the input digital signal DIN and generates control signals $b_1$ to $b_N$ and $t_1$ to $t_M$ for controlling the operations of the binary current-generating section 110 and the unary current-generating section 120, respectively.

The binary current-generating section 110 includes a set of current sources $I_{U11}$ to $I_{U1N}$, a set of switches $S_{11}$ to $S_{1N}$, and a R2R resistor network 115. The set of current sources $I_{U11}$ to $I_{U1N}$ are coupled in series with the set of switches $S_{11}$ to $S_{1N}$ between an upper voltage rail VDD and a set of nodes n1 to nN of the R2R resistor network 115, respectively.

The R2R resistor network 115 includes a resistor with a resistance R between node n1 and a source of a reference voltage $V_{REF}$. The R2R resistor network 115 includes another resistor with a resistance R coupled between node n1 and node n2 (not depicted). The R2R resistor network 115 further includes resistors with resistance of 2R between the nodes n2 to nN and the reference voltage source $V_{REF}$, respectively. Additionally, the R2R resistor network 115 includes resistors with resistors R between pair of nodes n2-n3 to nN-output node of the binary current-generating section 110, respectively.

If all the switches $S_{11}$ to $S_{1N}$ are closed, the set of current sources $I_{U11}$ to $I_{U1N}$ are ideally configured to provide substantially the same amount of currents $I_U$ to the set of nodes n1 to nN of the R2R resistor network 115, respectively. The R2R resistor network 115 applies binary weights (e.g., $(\frac{1}{2})^N$, $(\frac{1}{2})^{N-1}$ to $\frac{1}{2}$ to the currents $I_U$ generated by the current sources $I_{U11}$, $I_{U12}$ to $I_{U1N}$, respectively. The R2R resistor network 115 sums all the binary-weighted currents to generate an intermediate current $I_{int}$.

The control signals $b_1$ to $b_N$ generated by the decoder 150 based on the input digital signal DIN control the close/open states of the set of switches $S_{11}$ to $S_{1N}$, respectively. Thus, if any one or more of the control signals $b_1$ to $b_N$ are asserted, the corresponding one or more of the switches $S_{11}$ to $S_{1N}$ are in the closed state; allowing the corresponding one or more currents $I_U$ to be applied to the corresponding one or more of the nodes n1 to nN of the R2R resistor network 115; and allowing the corresponding one or more binary-weighted currents to be summed to form the intermediate current $I_{int}$.

Conversely, if any one or more of the control signals $b_1$ to $b_N$ are deasserted, the corresponding one or more of the switches $S_{11}$ to $S_{1N}$ are in the open state; preventing the corresponding one or more currents $I_U$ to be applied to the corresponding one or more of the nodes n1 to nN of the R2R resistor network 115; and not allowing the corresponding one or more binary-weighted currents to be summed to form the intermediate current $I_{int}$. Accordingly, the decoder 150 sets the states of the control signals $b_1$ to $b_N$ so that the binary current-generating section 110 generates the intermediate current $I_{int}$ based on the input digital signal DIN.

The unary current-generating section 120 includes a set of current sources $I_{U21}$ to $I_{U2M}$ and a set of switches $S_{21}$ to $S_{2M}$ (e.g., transistors) coupled in series between the upper voltage rail VDD and the output of the current DAC 100. The control signals $t_1$ to $t_M$ generated by the decoder 150 controls the close/open states of the switches $S_{21}$ to $S_{2M}$, respectively. Each of the current sources $I_{U21}$ to $I_{U2M}$ are ideally configured to generate substantially the same amount of current $I_U$.

Thus, if any one or more of the control signals $t_1$ to $t_M$ are asserted, the corresponding one or more of the switches $S_{21}$ to $S_{2M}$ are in the closed state; thereby allowing the corresponding one or more currents $I_U$ to be summed with the intermediate current $I_{int}$ generated by the binary current-generating section 110 to form the output current $I_{OUT}$ of the current DAC 100.

If any one or more of the control signals $t_1$ to $t_M$ are deasserted, the corresponding one or more of the switches $S_{21}$ to $S_{2M}$ are in the open state; thereby not allowing the corresponding one or more currents $I_U$ to be summed with the intermediate current $I_{int}$ generated by the binary current-generating section 110 to form the output current $I_{OUT}$ of the current DAC 100.

Thus, the binary current-generating section 110 is configured to provide a fine resolution intermediate current $I_{int}$ (e.g., resolution of $(\frac{1}{2})^N * I_U$) contribution to the output current $I_{OUT}$ based on the control signals $b_1$ to $b_N$ generated by the decoder 150 based on the input current signal DIN. The unary current-generating section 120 is configured to provide a course resolution intermediate current $I_{int}$ (e.g., resolution of an $I_U$) contribution to the output current $I_{OUT}$ based on the control signals $t_1$ to $t_M$ generated by the decoder 150 based on the input current signal DIN.

Figure 2:
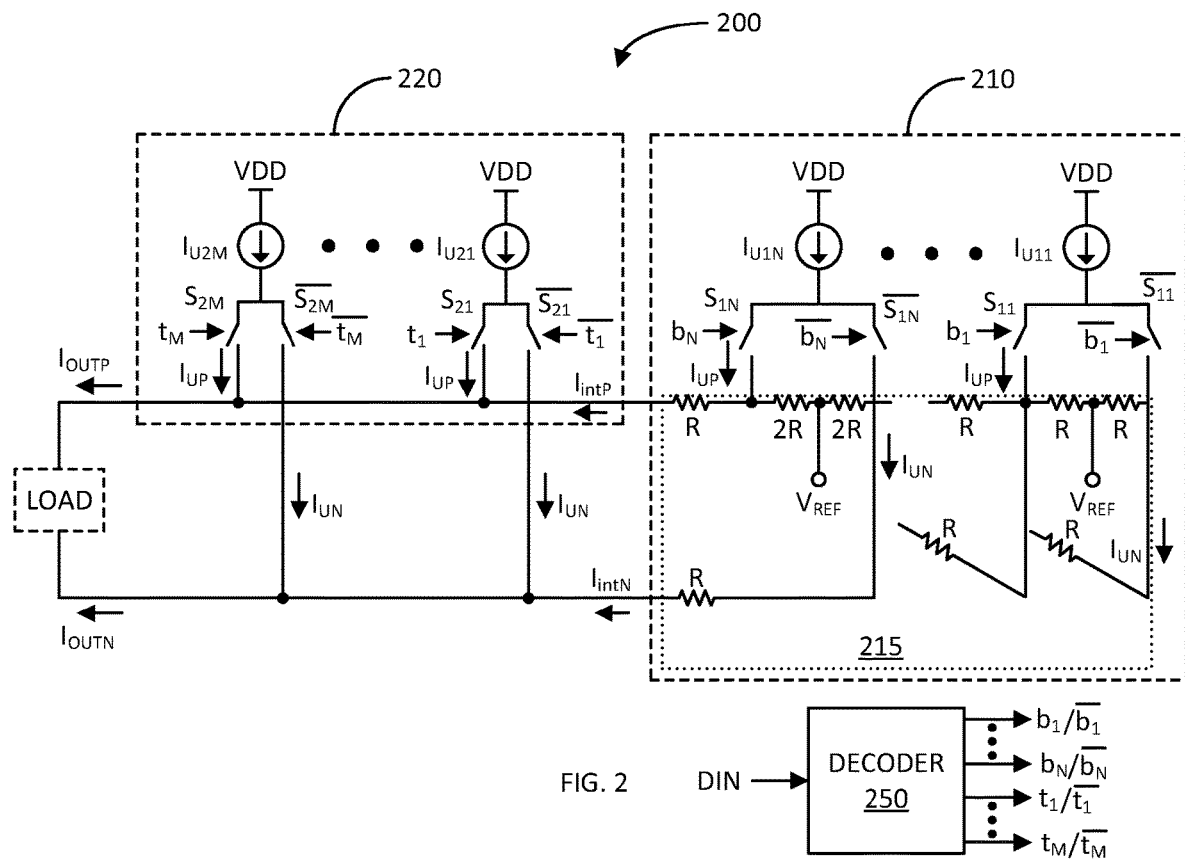
FIG. 2 illustrates a schematic diagram of an exemplary current-steering digital-to-analog converter (DAC) in accordance with another aspect of the disclosure.

FIG. 2 illustrates a schematic diagram of an exemplary current-steering digital-to-analog converter (DAC) 200 in accordance with another aspect of the disclosure. The current-steering DAC 200 is similar to that of current DAC 100, but instead generates an analog differential output current $I_{OUTP}/I_{OUTN}$ based on the input digital signal DIN. The differential output current $I_{OUTP}/I_{OUTN}$ may be differentially provided to a load, such as a filter or other device, for processing the analog differential output current $I_{OUTP}/I_{OUTN}$.

The current-steering DAC 200 includes a differential binary current-generating section 210, a differential binary current-generating section 220, and a decoder 250. The decoder 250 receives an input digital signal DIN and generates complementary control signals $b_1/\overline{b_1}$ to $b_N/\overline{b_N}$ and $t_1/\overline{t_1}$ to $t_M/\overline{t_M}$ for controlling the operations of the differential binary current-generating section 210 and the differential unary current-generating section 220 based on the input current signal DIN.

The differential binary current-generating section 210 includes a set of current sources $I_{U11}$ to $I_{U1N}$, a set of non-complementary switches $S_{11}$ to $S_{1N}$, a set of complementary switches $\overline{S_{11}}$ to $\overline{S_{1N}}$, and a differential R2R resistor network 215. The set of current sources $I_{U11}$ to $I_{U1N}$ are coupled in series with the set of non-complementary switches $S_{11}$ to $S_{1N}$ between an upper voltage rail VDD and a set of non-complementary nodes of the differential R2R resistor network 215. Also, the set of current sources $I_{U11}$ to $I_{U1N}$ are coupled in series with the set of complementary switches $\overline{S_{11}}$ to $\overline{S_{1N}}$ between the upper voltage rail VDD and a set of complementary nodes of the differential R2R resistor network 215.

The differential R2R resistor network 215 includes two resistors with resistance R coupled between complementary nodes of the first-stage (associated with current source $I_{U11}$) The node between the two resistors is coupled to a source of a reference voltage $V_{REF}$. The differential R2R resistor network 215 further includes two resistors of resistance R coupled between the complementary nodes of the first stage and the complementary nodes of the second stage (associated with current source $I_{U12}$ not shown for simplicity sake), respectively. The differential R2R resistor network 215 includes two resistors with resistance 2R coupled between complementary nodes of the second-stage. The node between the two resistors is coupled to the reference voltage source $V_{REF}$. The pattern of the two resistors with resistance of 2R between the complementary nodes of the current stage with the-between node coupled to the source of the reference voltage, and the two resistors with resistance R coupled between the complementary nodes of the current stage and the complementary nodes of the following stage, is repeated until the last Nth stage. The differential R2R resistor network 215 further includes a pair of resistors with resistance R coupled between the complementary nodes of the Nth stage and the complementary outputs of the differential binary current-generating section 210.

The complementary control signals $b_1/\overline{b_1}$ to $b_N/\overline{b_N}$ generated by the decoder 250 controls the close/open states of the complementary switches $S_{11}/\overline{S_{11}}$ to $S_{1N}/\overline{S_{1N}}$, respectively. Thus, if any one or more of the complementary control signals $b_1/\overline{b_1}$ to $b_N/\overline{b_N}$ are asserted, the corresponding one or more of the complementary switches $S_{11}/\overline{S_{11}}$ to $S_{1N}/\overline{S_{1N}}$ are in the closed/open states; allowing the corresponding one or more currents $I_U$ to be applied to the corresponding one or more of the non-complementary nodes of the differential R2R resistor network 215; and allowing the corresponding one or more binary-weighted currents (similar to DAC 100) to be summed to form a positive intermediate current $I_{intP}$.

If any one or more of the complementary control signals $b_1/\overline{b_1}$ to $b_N/\overline{b_N}$ are deasserted, the corresponding one or more of the complementary switches $S_{11}/\overline{S_{11}}$ to $S_{1N}/\overline{S_{1N}}$ are in the open/closed states; allowing the corresponding one or more currents $I_U$ to be applied to the corresponding one or more of the complementary nodes of the differential R2R resistor network 215; and allowing the corresponding one or more binary-weighted (similar to DAC 100) currents to be summed to form a negative intermediate current $I_{intN}$. Accordingly, the decoder 250 sets the states of the complementary control signals $b_1/\overline{b_1}$ to $b_N/\overline{b_N}$ so that the differential binary current-generating section 210 generates positive and negative intermediate currents $I_{intP}$ and $I_{intN}$ based on the input digital signal DIN.

The differential unary current-generating section 220 includes a set of current sources $I_{U21}$ to $I_{U2M}$, a set of non-complementary switches $S_{21}$ to $S_{2M}$ (e.g., transistors), and a set of complementary switches $\overline{S_{21}}$ to $\overline{S_{2M}}$ (e.g., transistors). The set of current sources $I_{U21}$ to $I_{U2M}$ are coupled in series with the set of non-complementary switches $S_{21}$ to $S_{2M}$ between the upper voltage rail VDD and the positive output of the current-steering DAC 200. Also, the set of current sources $I_{U21}$ to $I_{U2M}$ are coupled in series with the set of complementary switches $\overline{S_{21}}$ to $\overline{S_{2M}}$ between the upper voltage rail VDD and the negative output of the current-steering DAC 200.

The complementary control signals $t_1/\overline{t_1}$ to $t_M/\overline{t_M}$ generated by the decoder 250 controls the close/open states of the complementary switches $S_{21}/\overline{S_{21}}$ to $S_{2M}/\overline{S_{2M}}$, respectively. The set of current sources $I_{U21}$ to $I_{U2M}$ are each ideally configured to generate substantially the same current $I_U$. Thus, if any one or more of the complementary control signals $t_1/\overline{t_1}$ to $t_M/\overline{t_M}$ are asserted, the corresponding one or more of the complementary switches $S_{21}/\overline{S_{21}}$ to $S_{2M}/\overline{S_{2M}}$ are in the closed/open states; thereby allowing the corresponding one or more currents $I_U$ to be summed with the positive intermediate current $I_{intP}$ generated by the differential binary current-generating section 210 to form the positive output current $I_{OUTP}$ of the current-steering DAC 200.

If any one or more of the complementary control signals $t_1/\overline{t_1}$ to $t_M/\overline{t_M}$ are deasserted, the corresponding one or more of the complementary switches $S_{21}/\overline{S_{21}}$ to $S_{2M}/\overline{S_{2M}}$ are in the open/closed states; thereby allowing the corresponding one or more currents $I_U$ to be summed with the negative intermediate current $I_{intN}$ generated by the differential binary current-generating section 210 to form the negative output current $I_{OUTN}$ of the current-steering DAC 200.

Thus, the differential binary current-generating section 210 is configured to provide fine resolution differential intermediate current $I_{intP}/I_{intN}$ (e.g., resolution of $(½)^N*I_U$) contribution to the differential output current $I_{OUTP}/I_{OUTN}$ based on the complementary control signals $b_1/\overline{b_1}$ to $b_N/\overline{b_N}$ generated by the decoder 250 based on the input current signal DIN. The differential unary current-generating section 220 is configured to provide a course resolution differential current (e.g., resolution of an $I_U$) contribution to the differential output current $I_{OUTP}/I_{OUTN}$ based on the complementary control signals $t_1/\overline{t_1}$ to $t_M/\overline{t_M}$ generated by the decoder 250 based on the input current signal DIN.

Figure 3:
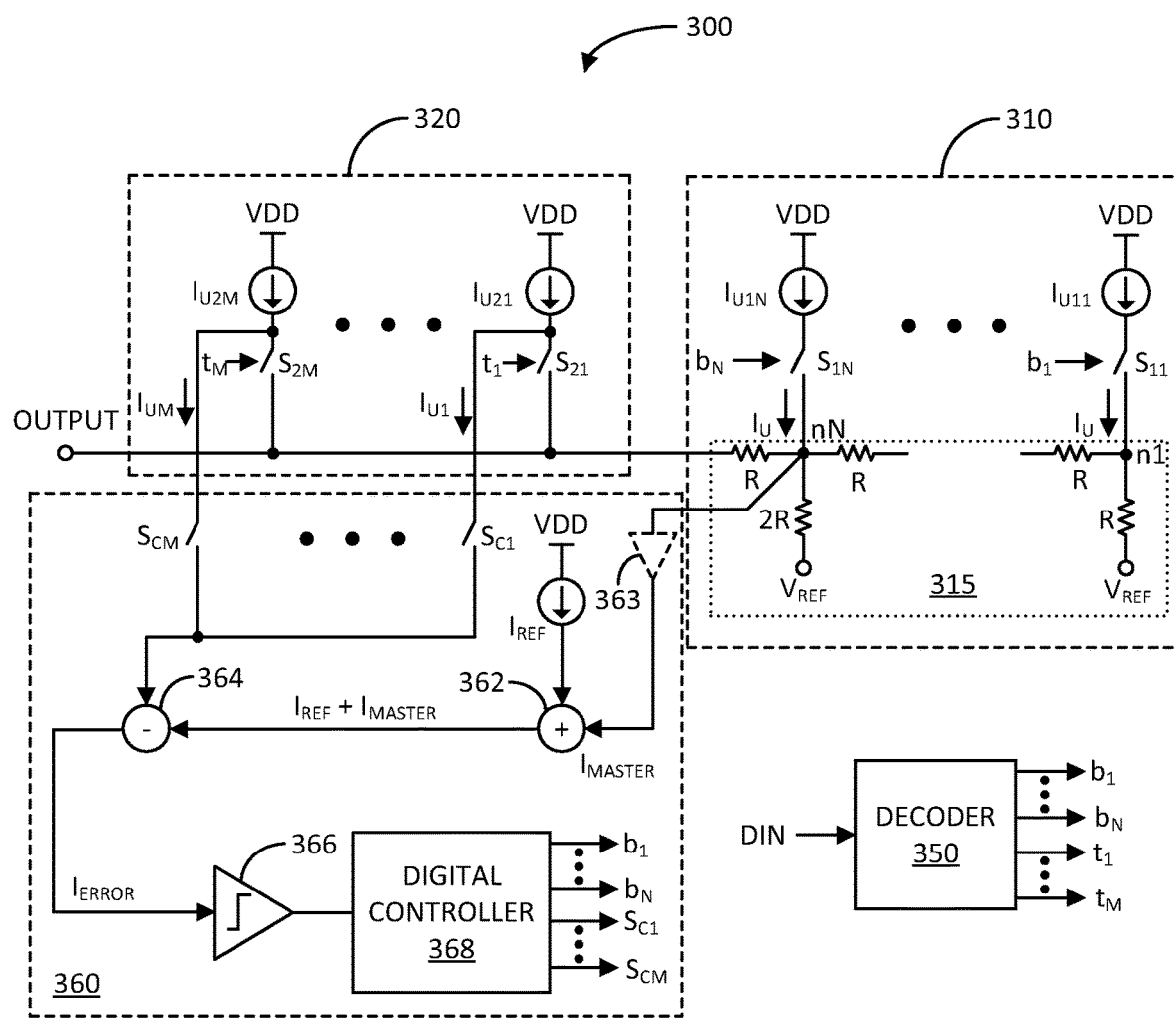
FIG. 3 illustrates a schematic diagram of an exemplary current digital-to-analog converter (DAC) with a current source mismatch measurement circuit in accordance with another aspect of the disclosure.

FIG. 3 illustrates a schematic diagram of an exemplary current digital-to-analog converter (DAC) 300 with a current source mismatch measurement circuit in accordance with an aspect of the disclosure. In order for a current DAC to accurately convert an input data signal into an analog output current, the current sources of the current DAC should produce substantially equal currents $I_U$, as discussed with reference to DACs 100 and 200. If there are mismatches between the currents $I_U$ generated by the current sources, the output current may be generated less accurately. Thus, there is a need to measure the current mismatches between the current sources of a current DAC for calibration, error correction, and/or other purposes.

The current DAC 300 is similar to that of current DAC 100, and includes and reuses many of the same elements as indicated by the same reference numbers and similar reference numbers with a "3" as the most significant digit (MSD) instead of a "1". In particular, the current DAC 300 includes a binary current-generating section 310, a unary current-generating section 320, and a decoder 350. These elements have been described in detail with reference to the description of current DAC 100.

Additionally, the current DAC 300 includes a circuit 360 configured to combine current to measure mismatches between the currents $I_{U1}$ to $I_{UM}$ generated by the current sources $I_{U21}$ and $I_{U2M}$, respectively. The current combining circuit 360 includes a reference current source $I_{REF}$, a current summer 362, a current subtractor 364, a current comparator 366, a digital controller 368 configured to determine a current mismatch, and a set of switches $S_{C1}$ to $S_{CM}$. The current combining circuit 360 may also include an element or device 363 to buffer, scale, amplify, and/or attenuate the current $I_{MASTER}$. The input of this element or scaling device 363 can be coupled to the main output current of the R2R resistor network 315 (as shown), or alternatively, may be coupled to any of the internal nodes n1 to nN of the R2R resistor network 315.

The reference current source $I_{REF}$ is configured to generate a calibrated reference current $I_{REF}$. The reference current source $I_{REF}$ is coupled between an upper voltage rail VDD and a first input to the current summer 362. As discussed in more detail below, during current mismatch measurement, the binary current-generating section 310 is operated to generate a current $I_{MASTER}$, which is applied to a second input of the current summer 362. The current summer 362 sums the reference current $I_{REF}$ with the current $I_{MASTER}$ from the binary current-generating section 310. Optional scaling device 363 can be used to set the range or step size of $I_{MASTER}$, as best suited for a given application.

The set of switches $S_{C1}$ to $S_{CM}$ is coupled between the set of current sources $I_{U21}$ to $I_{U2M}$ and a first input of the current subtractor 364, respectively. The summed current $I_{REF}+I_{MASTER}$ generated by the current summer 362 is provided to a second input of the current subtractor 364. The current subtractor 364 generates an error current $I_{ERROR}$ based on a difference between the current from a selected one of the current sources $I_{U21}$ to $I_{U2M}$ (associated with a selected closed one of the set of switches $S_{C1}$ to $S_{CM}$) and the summed current $I_{REF}+I_{MASTER}$.

The current comparator 366 compares the error current $I_{ERROR}$ to a threshold current (not shown as ideally it is zero). If the error current $I_{ERROR}$ is below the threshold current, the current comparator 366 generates a logic zero (0). If the error current $I_{ERROR}$ is above the threshold current, the current comparator 366 generates a logic one (1). The logic output from the current comparator 366 is provided to the controller 368. It shall be understood that the current comparator 366 may generate a non-binary output, such as an analog output based on a comparison of the error current $I_{ERROR}$ to the threshold current.

The controller 368 controls the current mismatch measurement and generates the control signals $b_1$ to $b_N$ and $S_{C1}$ to $S_{CM}$ for the binary current-generating section 310 and the set of switches $S_{C1}$ to $S_{CM}$ pursuant to the current mismatch measurement, respectively. The current mismatch measurement operates as follows.

In this example, the current mismatch measurement begins with measuring the current mismatch associated with the current $I_{U1}$ generated by the current source $I_{U21}$. In this regard, the current mismatch controller 368 asserts the control signal $S_{C1}$ and deasserts the control signals $S_{C2}$ to $S_{CM}$ to close switch $S_{C1}$ and open switches $S_{C2}$ to $S_{CM}$. The closed switch $S_{C1}$ routes the current $I_{U1}$ to the first input of the current subtractor 364. Also, the current mismatch controller 368 deasserts the control signals $b_1$ to $b_N$ so that the current $I_{MASTER}$ generated by the binary current-generating section 310 is substantially nil or zero (or defined value). Although setting the current $I_{MASTER}$ to zero is used to exemplify the current mismatch measurement, it shall be understood that the current $I_{MASTER}$ may be set to a predefined non-zero current.

Accordingly, as the current $I_{MASTER}$ is substantially nil, the current summer 362 outputs the reference current $I_{REF}$, which is provided to the second input of the current subtractor 364. Accordingly, the current subtractor 364 generates the error current $I_{ERROR}$ as the difference between the current $I_{U1}$ from the current source $I_{U21}$ and the reference current $I_{REF}$. Thus, the error current $I_{ERROR}$ represents the current mismatch associated with the current $I_{U1}$ generated by the current source $I_{U21}$. The error current $I_{ERROR}$ is positive and, in this example, greater than the current threshold of the current comparator 366, which may be set close to zero (0) current. Thus, the current comparator 366 initially outputs a logic one (1).

To quantify the mismatch $I_{ERROR}$ for storage and later use, the controller 368 begins binary adjusting (e.g., incrementing) the control signals $b_1$ to $b_N$ to adjust (e.g., increment) the current $I_{MASTER}$ by the resolution (e.g., $(½)^N$) for each LSB increment of the control signals $b_1$ to $b_N$ to selectively open/close switches $S_{11}$ to $S_{1N}$ of the binary current-generating section 310. The incrementing current $I_{MASTER}$, via the current summer 362 and the current subtractor 364, causes the error current $I_{ERROR}$ to decrease. When the error current $I_{ERROR}$ decreases below the current threshold of the current comparator 366, the current comparator 366 generates a logic zero (0).

In response to the logic zero (0), the current mismatch controller 368 stops incrementing the control signals $b_1$ to $b_N$. The current value of the control signals $b_1$ to $b_N$ represents the current mismatch associated with the current $I_{U1}$ generated by the current source $I_{U21}$. If, as discussed above, the initial $I_{MASTER}$ current is set to a non-zero current, the value of the control signals $b_1$ to $b_N$ associated with the initial $I_{MASTER}$ current may need to be subtracted from the current value of the control signals $b_1$ to $b_N$ to arrive at the current mismatch value. The current mismatch controller 368 stores the value of the control signals $b_1$ to $b_N$ for later use in calibrating the current source $I_{U21}$, correcting the output current, and/or perform any operation based of such value. This process is repeated for the other current sources $I_{U22}$ to $I_{U2M}$ to measure their current mismatches. It shall be understood that other algorithms, such as successive approximation, can be utilized by the controller 368.

An advantage of the DAC 300 (as well as the other DACs 400-600 described herein) is that the DAC 300 leverages the fine-resolution of the binary-weighted current-generating section 310 to determine the current mismatch between each of the unary current sources $I_{U21}$ to $I_{U2M}$ and the reference current $I_{REF}$ for calibration purposes. As the resolution of the binary-weighted current-generating section 310 is on the order of $½^N$, the current mismatch can be quantified with high accuracy. Without this self-measurement and calibration, the currents from the unary current sources $I_{U21}$ to $I_{U2M}$ and the reference current $I_{REF}$ may need to be sent to an external measurement equipment for current mismatch measurements and calibration.

Figure 4:
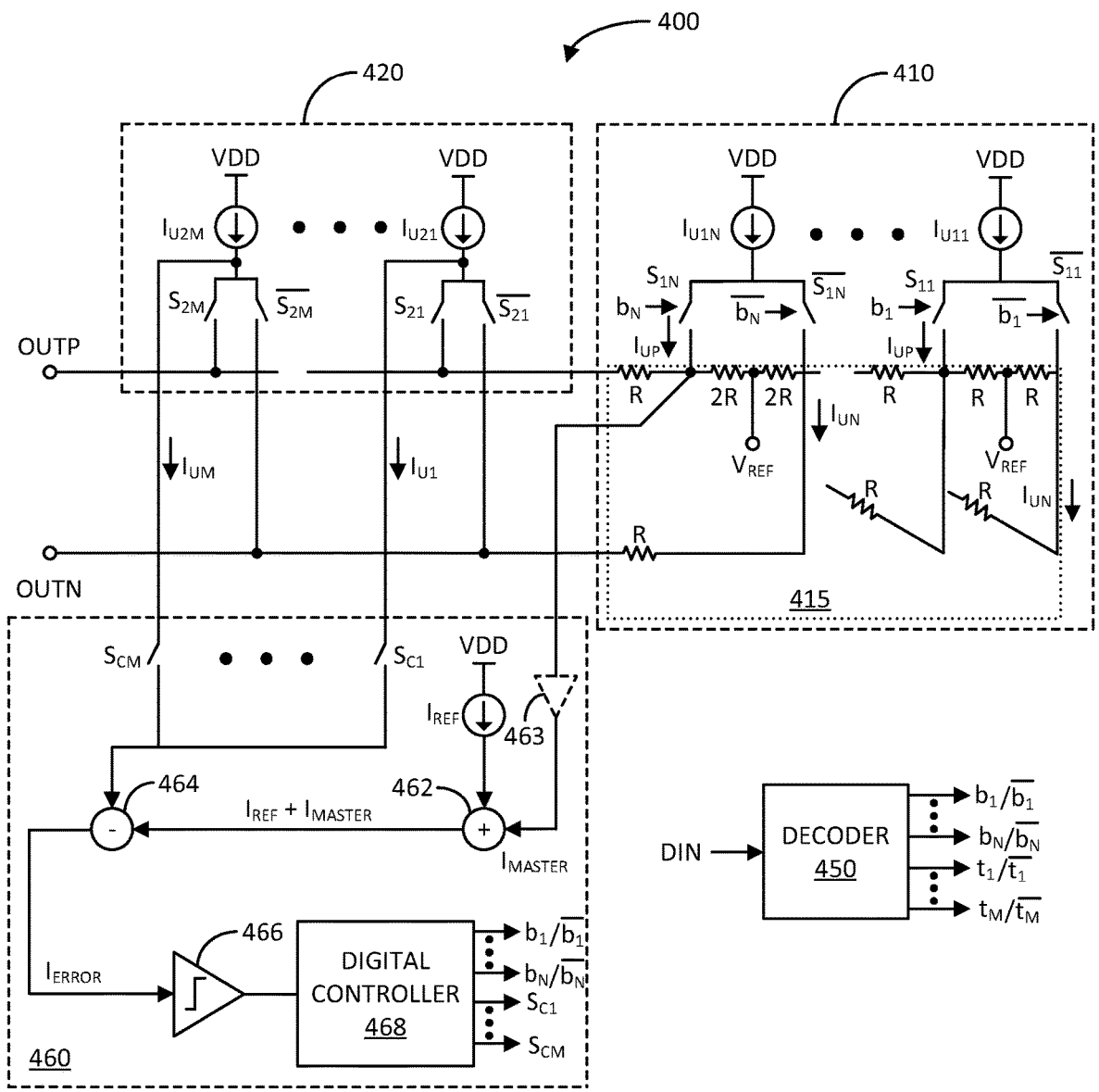
FIG. 4 illustrates a schematic diagram of an exemplary current-steering digital-to-analog converter (DAC) with a current source mismatch measurement circuit in accordance with another aspect of the disclosure.

FIG. 4 illustrates a schematic diagram of an exemplary current-steering digital-to-analog converter (DAC) 400 with a current source mismatch measurement circuit in accordance with another aspect of the disclosure. In summary, the current-steering DAC 400 is in essence the differential version of current DAC 300.

The current-steering DAC 400 is also similar to that of current-steering DAC 200, and includes many of the same elements as indicated by the same reference numbers and similar reference numbers with a "4" as the MSD instead of a "2". In particular, the current-steering DAC 400 includes a differential binary current-generating section 410, a differential unary current-generating section 420, and a decoder 450. These elements have been described in detail with reference to the description of current-steering DAC 200.

Additionally, the current-steering DAC 400 includes a circuit 460 configured to combine currents to measure mismatches between the currents $I_{U1}$ to $I_{UM}$ generated by the current sources $I_{U21}$ and $I_{U2M}$, respectively. The current combining circuit 460 includes a reference current source $I_{REF}$, a current summer 462, a current subtractor 464, a current comparator 466, a current mismatch controller 468, and a set of switches $S_{C1}$ to $S_{CM}$. The current combining circuit 460 may also include an element or scaling device 463 to buffer, scale, amplify, and/or attenuate the current $I_{MASTER}$.

The reference current source $I_{REF}$ is configured to generate a calibrated reference current $I_{REF}$. The reference current source $I_{REF}$ is coupled between an upper voltage rail VDD and a first input to the current summer 462. As discussed in more detail below, during current mismatch measurement, the differential binary current-generating section 410 is operated to generate a current $I_{MASTER}$, which is applied to a second input of the current summer 462. The current summer 462 sums the reference current $I_{REF}$ with the current $I_{MASTER}$ from the differential binary current-generating section 410. Optional scaling device 463 can be used to set the range or step size of the current $I_{MASTER}$, as best suited for a given application.

The set of switches $S_{C1}$ to $S_{CM}$ is coupled between the set of current sources $I_{U21}$ to $I_{U2M}$ and a first input of the current subtractor 464, respectively. The summed current $I_{REF}$+$I_{MASTER}$ generated by the current summer 462 is provided to a second input of the current subtractor 464. The current subtractor 464 generates an error current $I_{ERROR}$ based on a difference between the current from a selected one of the current sources $I_{U21}$ to $I_{U2M}$ (associated with a selected closed one of the set of switches $S_{C1}$ to $S_{CM}$) and the summed current $I_{REF}$+$I_{MASTER}$.

The current comparator 466 compares the error current $I_{ERROR}$ to a threshold current (not shown). If the error current $I_{ERROR}$ is below the threshold current, the current comparator 466 generates a logic zero (0). If the error current $I_{ERROR}$ is above the threshold current, the current comparator 466 generates a logic one (1). The logic output from the current comparator 466 is provided to the controller 468.

The controller 468 controls the current mismatch measurement and generates the complementary control signals $b_1/\overline{b_1}$ to $b_N/\overline{b_N}$ and control signals $S_{C1}$ to $S_{CM}$ for the differential binary current-generating section 410 and the set of switches $S_{C1}$ to $S_{CM}$ pursuant to the current mismatch measurement, respectively. The current mismatch measurement operates as follows.

In this example, the current mismatch measurement begins with measuring the current mismatch associated with the current $I_{U1}$ generated by the current source $I_{U21}$. In this regard, the current mismatch controller 468 asserts the control signal $S_{C1}$ and deasserts the control signals $S_{E2}$ to $S_{CM}$ to close switch $S_{C1}$ and open switches $S_{E2}$ to $S_{CM}$. The closed switch $S_{C1}$ routes the current $I_{U1}$ to the first input of the current subtractor 464. Also, the current mismatch controller 468 deasserts the complementary control signals $b_1/\overline{b_1}$ to $b_N/\overline{b_N}$ so that the current $I_{MASTER}$ generated by the differential binary current-generating section 410 is substantially nil or zero.

Note, that in this example, the second input of the current summer 462 is coupled to the positive output of the differential binary current-generating section 410. Thus, the deasserted complementary control signals $b_1/\overline{b_1}$ to $b_N/\overline{b_N}$ cause the complementary switches $S_{11}/\overline{S_{11}}$ to $S_{1N}/\overline{S_{1N}}$ to direct all the currents to the negative output of the differential binary current-generating section 410; thereby substantially zeroing the current $I_{MASTER}$. It shall be understood that the second input of the current summer 462 may be coupled to the negative output of the differential binary current-generating section 410, and the current mismatch measurement process would need to be modified for such alternative configuration (e.g., initially asserting the complementary control signals $b_1/\overline{b_1}$ to $b_N/\overline{b_N}$ and correcting the final value of the differential binary current-generating section 410).

As the current $I_{MASTER}$ is substantially nil, the current summer 462 outputs the reference current $I_{REF}$, which is provided to the second input of the current subtractor 464. Accordingly, the current subtractor 464 generates the error current $I_{ERROR}$ as the difference between the current $I_{U1}$ from the current source $I_{U21}$ and the reference current $I_{REF}$. Thus, the error current $I_{ERROR}$ represents the current mismatch associated with the current $I_{U1}$ generated by the current source $I_{U21}$. The error current $I_{ERROR}$ is positive and, in this example, greater than the current threshold of the current comparator 466, which may be set close to zero (0) current. Thus, the current comparator 466 initially outputs a logic one (1).

To quantify the mismatch $I_{ERROR}$ for storage and later use, the controller 468 begins binary incrementing the control signals $b_1/\overline{b_1}$ to $b_N/\overline{b_N}$ to increment the current $I_{MASTER}$ by the resolution (e.g., $(½)^N$) for each LSB increment of the control signals $b_1/\overline{b_1}$ to $b_N/\overline{b_N}$. The incrementing current $I_{MASTER}$, via the current summer 462 and the current subtractor 464, causes the error current $I_{ERROR}$ to decrease. When the error current $I_{ERROR}$ decreases below the current threshold of the current comparator 466, the current comparator 466 generates a logic zero (0).

In response to the logic zero (0), the current mismatch controller 468 stops incrementing the control signals $b_1/\overline{b_1}$ to $b_N/\overline{b_N}$. The current value of the control signals $b_1/\overline{b_1}$ to $b_N/\overline{b_N}$ represents the current mismatch associated with the current $I_{U1}$ generated by the current source $I_{U21}$. The current mismatch controller 468 stores the value of the control signals $b_1/\overline{b_1}$ to $b_N/\overline{b_N}$ for later use in calibrating the current source $I_{U21}$, correcting the output current, and/or perform any operation based of such value. This process is repeated for the other current sources $I_{U22}$ to $I_{U2M}$ to measure their current mismatches.

Figure 5:
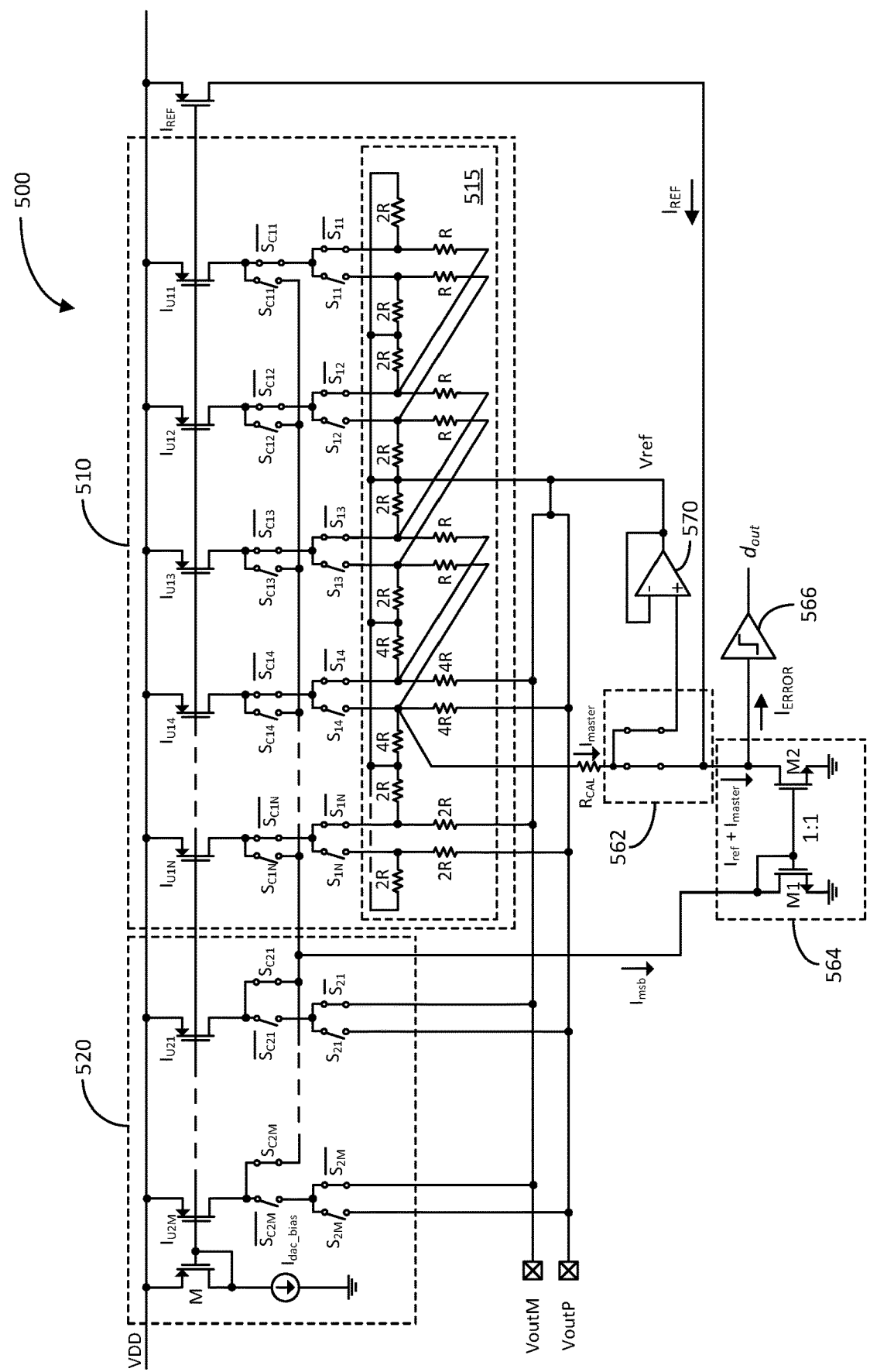
FIG. 5 illustrates a schematic diagram of another exemplary current-steering digital-to-analog converter (DAC) with a current source mismatch measurement circuit in accordance with another aspect of the disclosure.

FIG. 5 illustrates a schematic diagram of another exemplary current-steering digital-to-analog converter (DAC) 500 with a current source mismatch measurement circuit in accordance with another aspect of the disclosure. The current-steering DAC 500 is an exemplary more-detailed implementation of the current-steering DAC 400 previous discussed. Elements of current-steering DAC 500 that are similar to current-steering DAC 400 are labeled with similar reference numbers or letters (e.g., using MSD of "5" instead of MSD of "4" used in DAC 400).

The current-steering DAC 500 includes a differential binary current-generating section 510 including a differential R2R resistor network 515. In this example, the differential binary current-generating section 510 has a bit-depth of N bits, including current sources $I_{U11}$ to $I_{U1N}$ (each configured as a p-channel metal oxide semiconductor field effect transistor (PMOS FET)) and complementary switches $S_{11}/\overline{S_{11}}$ to $S_{1N}/\overline{S_{1N}}$ coupled to complementary nodes of the differential R2R resistor network 515, as previously discussed. The differential R2R resistor network 515 are coupled to differential output VoutM and VoutP for supplying the binary-weighted differential current thereto. Additionally, the differential binary current-generating section 510 may include optional complementary calibration switches $S_{C11}/\overline{S_{C11}}$ to $S_{C1N}/\overline{S_{C1N}}$ coupled between the current sources $I_{U11}$ to $I_{U1N}$ and a first input to a current subtractor 564 and complementary switches $S_{11}/\overline{S_{11}}$ to $S_{1N}/\overline{S_{1N}}$, respectively.

The current-steering DAC 500 also includes a differential unary current-generating section 520 including a bias current source $I_{dac\_bias}$, a current-mirroring transistor M, and a set of unary current sources $I_{U21}$ to $I_{U2M}$. The current-mirroring transistor M and the bias current source $I_{dac\_bias}$ are coupled in series between an upper voltage rail VDD and a low voltage rail (e.g., ground). The current-mirroring transistor M and unary current sources $I_{U21}$ to $I_{U2M}$ of the differential unary current-generating section 520 may each be configured as a PMOS FET. Note that the gates of the PMOS FETs M and $I_{U21}$ to $I_{2UM}$ are coupled together, and optionally coupled to gates of the PMOS FETs $I_{U11}$ to $I_{U1N}$ of the differential binary current-generating section 510. That is, the set of current sources $I_{U11}$ to $I_{U1N}$ may be separately controlled from the current sources $I_{U21}$ and $I_{U2M}$; in which case, the current sources $I_{U11}$ to $I_{U1N}$ will have its own bias current source Idac_bias and current-mirroring transistor M for setting the currents generated by current sources $I_{U11}$ to $I_{U1N}$.

The differential unary current-generating section 520 also includes complementary switches $S_{21}/\overline{S_{21}}$ to $S_{2M}/\overline{S_{2M}}$ for routing the currents from the current sources $I_{U21}$ to $I_{U2M}$ to the differential output VoutM and VoutP based on an input data signal DIN (not shown) during normal operation. Additionally, the differential unary current-generating section 520 includes complementary calibration switches $S_{C21}/\overline{S_{C21}}$ to $S_{C2M}/\overline{S_{C2M}}$ coupled between the current sources $I_{U21}$ to $I_{U2M}$ and the first input of the current subtractor 564 during calibration.

As previously discussed, the differential binary and unary current-generating sections 510 and 520 generate binary-weighted differential current and unary-weighted differential current, respectively, which are summed to produce a differential output current at the output VoutM and VoutP of the current-steering DAC 500 based on input data signal DIN. Although not shown for simplicity purpose, the current-steering DAC 500 includes a decoder/controller for generating the control signals for operating the complementary switches $S_{11}/\overline{S_{11}}$ to $S_{1N}/\overline{S_{1N}}$ and $S_{21}/\overline{S_{21}}$ to $S_{2M}/\overline{S_{2M}}$ of the differential binary and unary current-generating sections 510 and 520 based on the input data signal DIN, as previously discussed.

The current-steering DAC 500 includes a circuit configured to measure mismatches between the current $I_{msb}$ generated by the selected one of the current sources $I_{U21}$ to $I_{U2M}$ of the unary current-generating section 520. The current mismatch measuring circuit includes a reference current source $I_{REF}$, a current summer 562, the current subtractor 564, a current comparator 566, and a buffer 570. Although not shown for the sake of simplicity, the current mismatch measuring circuit also includes a current mismatch controller, as discussed with reference to current-steering DAC 400. The calibration switches $S_{C11}/\overline{S_{C11}}$ to $S_{C1N}/\overline{S_{C1N}}$ and $S_{C21}/\overline{S_{C21}}$ to $S_{C2M}/\overline{S_{C2M}}$ may be considered part of the current mismatch measuring circuit, as described with reference to DACs 300 and 400.

The reference current source $I_{REF}$ is configured to generate a calibrated reference current $I_{REF}$, which is applied to a first input of the current summer 562. The reference current source $I_{REF}$ may also be configured as a PMOS FET with gate coupled to the gates of the PMOS FETs $I_{U11}$ to $I_{U1N}$, and M and $I_{U21}$ to $I_{U2M}$ of the differential binary and unary current-generating sections 510 and 520, respectively. As previously discussed, during current mismatch measurement, the differential binary current-generating section 510 is operated to generate a current $I_{MASTER}$, which is applied to a second input of the current summer 562 via a calibration resistor $R_{CAL}$. During this unary current mismatch measurement mode, the calibration complementary switches $S_{C11}/\overline{S_{C11}}$ to $S_{C1N}/\overline{S_{C1N}}$ are operated such that they are all in the open/closed state. This directs the currents generated by the current sources $I_{U11}$ to $I_{U1N}$ to the differential R2R network 515 based on the control for complementary switches $S_{11}/\overline{S_{11}}$ to $S_{1N}/\overline{S_{1N}}$, respectively. The resistor $R_{CAL}$ is an exemplary implementation of the scaling 463 in FIG. 4. The current summer 562 sums the reference current $I_{REF}$ with the current $I_{MASTER}$ from the differential binary current-generating section 510.

As discussed, the complementary calibration switches $\overline{S_{C21}}$ to $\overline{S_{C2M}}$ are coupled between the unary current sources $I_{U21}$ to $I_{U2M}$ and the first input of the current subtractor 564, respectively. During unary current mismatch measurement mode, the complementary calibration switches corresponding to the selected current source is in the open/closed state, and the complementary calibration switches corresponding to the unselected current sources are in the closed/open state. This directs only the current from the selected current source to the first input of the current subtractor 564. The current subtractor 564 is configured as a current mirror including a pair of n-channel MOS FETs (NMOS FETs) M1 and M2, with gates coupled together and sources coupled to ground. The drain of the NMOS FET M1 is coupled to the gates of both NMOS FETs M1 and M2. It shall be understood that the current subtractor 564 is merely one exemplary implementation, and may have a different implementation, such as a bipolar implementation, a cascoded mirror configuration, source-degenerated current mirror, etc.

The summed current $I_{REF}+I_{MASTER}$ generated by the current summer 562 is provided to a second input of the current subtractor 564 (e.g., to the drain of the NMOS FET M2). The current $I_{msb}$ from the selected unary current source of the unary current-generating section 520 is provided to the drain of the NMOS FET M1 via the corresponding closed calibration switch. Because of the current-mirror relationship of the NMOS FETs M1 and M2 of the current subtractor 564, the respective currents through the NMOS FETs M1 and M2 are substantially the same (assuming a mirror ratio of one (1)). Thus, to achieve this equality, the current subtractor 564 generates an error current $I_{ERROR}$ based on a difference between the current $I_{msb}$ and the summed current $I_{REF}+I_{MASTER}$. Note that the mirror ratio does not need to be one (1), and other ratio could be used in some applications.

The current comparator 566 compares the error current $I_{ERROR}$ to a threshold current (not shown). If the error current $I_{ERROR}$ is below the threshold current, the current comparator 566 generates $d_{out}$ as a logic zero (0). If the error current $I_{ERROR}$ is above the threshold current, the current comparator 566 generates $d_{out}$ as a logic one (1). The logic output $d_{out}$ from the current comparator 566 is provided to the current mismatch controller (not shown). The current comparator 566 may include a transimpedance amplifier (TIA) configured to generate a voltage based on the current $I_{ERROR}$, the voltage being compared to a threshold voltage in generating $d_{out}$.

In order for the error current $I_{ERROR}$ to be accurately generated, it may be beneficial that the voltage potential at the input of the current comparator 566 is substantially equal to the voltage potential at the reference voltage node $V_{REF}$ of the differential R2R resistor network 515. To accomplish this, the buffer 570 includes an input coupled to the input of the current comparator 566 and an output coupled to the reference voltage node $V_{REF}$ of the differential R2R resistor network 515. Note the implementation of the buffer 570 using in amplifier in unity-gain-feedback configuration is shown as example here and other implementation of a voltage buffer could be used.

As discussed in detail with reference to current-steering DAC 400, the current mismatch controller controls the current mismatch measurement and generates the complementary control signals for the switches of the differential binary current-generating section 510 and the switches of the differential unary current-generating section 520 pursuant to the unary current mismatch measurement. The final value of the differential binary current-generating section 510 provides the current mismatch associated with the selected current source of the unary current-generating section 520. Although the DAC 500 is exemplified as a differential or current-steering DAC, it shall be understood that implementation is applicable (with alterations) to a single-ended DAC, such as current DAC 300.

As discussed, the current-steering DAC 500 further includes a set of calibration switches $S_{C11}$ to $S_{C1N}$ coupled between the current sources $I_{U11}$ to $I_{U1N}$ of the differential binary current-generation section 510 and the first input of the current subtractor 564, respectively. It may be desirable for calibration or other purposes to determine the difference between the currents generated by the current sources $I_{U11}$ to $I_{U1N}$ and the reference current $I_{REF}$. This is referred to herein as a binary current mismatch measurement mode.

Pursuant to the binary current mismatch mode, the complementary calibration switches $S_{C21}/\overline{S_{C21}}$ to $S_{C2M}/\overline{S_{C2M}}$ of the unary current-generating section 520 are all in the closed/open state to electrically decouple or isolate the unary current sources $I_{U21}$ to $I_{U2M}$ from the first input of the current subtractor 564. Also, the complementary calibration switches corresponding to the selected current source of the binary current-generating section 510 is in the closed/open state, and the complementary calibration switches corresponding to the unselected current sources of the binary current-generating section 510 are in the open/closed state. This directs only the current from the selected binary current source to the first input of the current subtractor 564. In this measurement mode, the complementary switches $S_{11}/\overline{S_{11}}$ to $S_{1N}/\overline{S_{1N}}$ are all in the open/closed state to direct the current from the unselected binary current sources to the output VoutM, and away from the second input of the current summer 562. Thus, the $I_{master}$ in this mode is substantially nil.

In the binary current mismatch measurement mode, the output of the current subtractor 564 generates the error current $I_{ERROR}$ as a function of the difference or weighted-difference between the current $I_{msb}$ generated by the selected binary current source and the reference current $I_{REF}$, for use in calibration or other purpose, and may be applied to the input of the current comparator 566 or other device pursuant to the desired measurement. If the threshold of the current comparator 566 is set to zero (0), then its output dout provides an indication whether the current generated by the selected current source is greater or less than the reference current $I_{REF}$.

Figure 6:
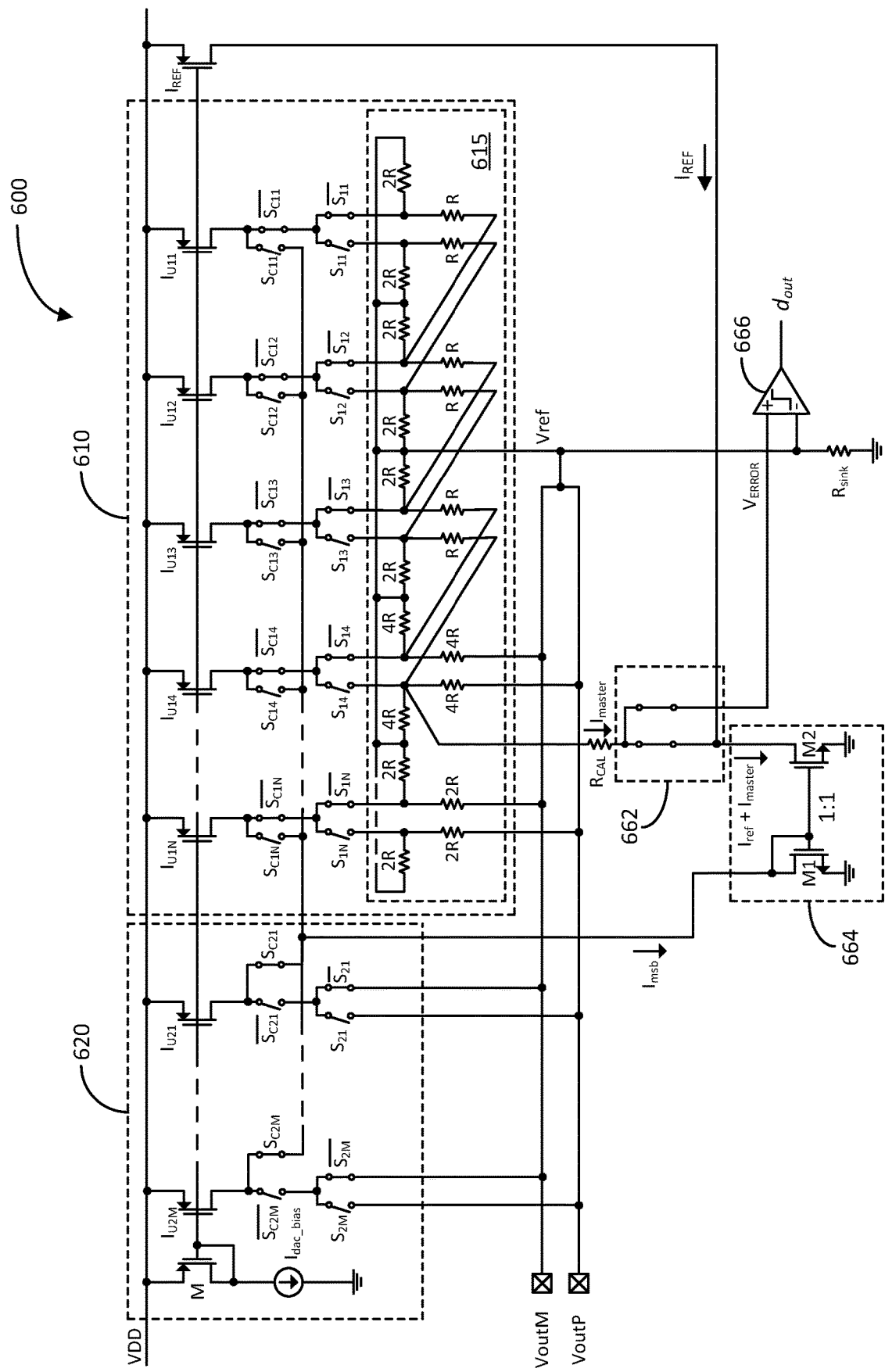
FIG. 6 illustrates a schematic diagram of another exemplary current-steering digital-to-analog converter (DAC) with a current source mismatch measurement circuit in accordance with another aspect of the disclosure.

FIG. 6 illustrates a schematic diagram of another exemplary current-steering digital-to-analog converter (DAC) 600 with a current source mismatch measurement circuit in accordance with another aspect of the disclosure. The current-steering DAC 600 is another exemplary more-detailed implementation of the current-steering DAC 400 previous discussed. Elements of current-steering DAC 600 that are similar to current-steering DAC 400 are labeled with similar reference numbers or letters (e.g., using MSD of "6" instead of MSD of "4" used in DAC 400).

The current-steering DAC 600 is also similar to current-steering DAC 500, but instead of the output signal $d_{out}$ being based on an error current $I_{ERROR}$, the current-steering DAC 600 generates an output signal $d_{out}$ based on an error voltage $V_{ERROR}$. In this implementation, the voltage buffer 570 is not needed. In the case of current-steering DAC 600, a voltage comparator generates an output signal $d_{out}$ based on an error voltage $V_{ERROR}$ for use in performing the current mismatch measurement.

The current-steering DAC 600 includes a differential binary current-generating section 610 including a differential R2R resistor network 615. In this example, the differential binary current-generating section 610 has a bit-depth of N bits, including current sources $I_{U11}$ to $I_{U1N}$ (each configured as a PMOS FET) and complementary switches $S_{11}/\overline{S_{11}}$ to $S_{1N}/\overline{S_{1N}}$ coupled to complementary nodes of the differential R2R resistor network 615, as previously discussed. The differential R2R resistor network 615 are coupled to differential output VoutM and VoutP for supplying the binary-weighted differential current thereto. Additionally, the differential binary current-generating section 610 may include optional complementary calibration switches $S_{C11}/\overline{S_{C11}}$ to $S_{C1N}/\overline{S_{C1N}}$ coupled between the current sources $I_{U11}$ to $I_{U1N}$ and a first input to a current subtractor 664 and complementary switches $S_{11}/\overline{S_{11}}$ to $S_{1N}/\overline{S_{1N}}$, respectively.

The current-steering DAC 600 also includes a differential unary current-generating section 620 including a bias current source Idac_bias, a current-mirroring transistor M, and a set of unary current sources $I_{U21}$ to $I_{U2M}$. The current-mirroring transistor M and the bias current source $I_{dac\_bias}$ are coupled in series between an upper voltage rail VDD and a low voltage rail (e.g., ground). The current current-mirroring transistor M and unary current sources $I_{U21}$ to $I_{U2M}$ of the differential unary current-generating section 620 may each be configured as a PMOS FET. Note that the gates of the PMOS FETs M and $I_{U21}$ to $I_{U2M}$ are coupled together, and also optionally coupled to gates of the PMOS FETs $I_{U11}$ to $I_{U1N}$ of the differential binary current-generating section 610. That is, the set of current sources $I_{U11}$ to $I_{U1N}$ may be separately controlled from the current sources $I_{U21}$ and $I_{U2M}$; in which case, the current sources $I_{U11}$ to $I_{U1N}$ will have its own bias current source Idac_bias and current-mirroring transistor M for setting the currents generated by current sources $I_{U11}$ to $I_{U1N}$.

The differential unary current-generating section 620 also includes complementary switches $S_{21}/\overline{S_{21}}$ to $S_{2M}/\overline{S_{21M}}$ for routing the currents from the current sources $I_{U21}$ to $I_{U2M}$ to the differential output VoutM and VoutP based on an input data signal DIN (not shown) during normal operation. Additionally, the differential unary current-generating section 620 includes complementary calibration switches $S_{C21}/\overline{S_{C21}}$ to $S_{C2M}/\overline{S_{C2M}}$ coupled between the current sources $I_{U21}$ to $I_{U2M}$ and the first input to the current subtractor 664 during calibration mode.

As previously discussed, the differential binary and unary current-generating sections 610 and 620 generate binary-weighted differential current and unary-weighted differential current, respectively, which are summed to produce a differential output current at the output VoutM and VoutP of the current-steering DAC 600 based on input data signal DIN. Although not shown for simplicity purpose, the current-steering DAC 600 includes a decoder/controller for generating the control signals for operating the complementary switches $S_{11}/\overline{S_{11}}$ to $S_{1N}/\overline{S_{1N}}$ and $S_{21}/\overline{S_{21}}$ to $S_{2M}/\overline{S_{2M}}$ of the differential binary and unary current-generating sections 610 and 620 based on the input data signal DIN, as previously discussed.

The current-steering DAC 600 includes a circuit configured to measure mismatches between the currents $I_{msb}$ generated by the selected one of the current sources $I_{U21}$ to $I_{U2M}$ of the unary current-generating section 620. The current mismatch measuring circuit includes a reference current source $I_{REF}$, a current summer 662, the current subtractor 664, and a differential voltage comparator 666 with associated resistor $R_{sink}$. Although not shown for the sake of simplicity, the current mismatch measuring circuit also includes a digital controller, as discussed with reference to current-steering DAC 400. The calibration switches $S_{C11}/\overline{S_{C11}}$ to $S_{C1N}/\overline{S_{C1N}}$ and $S_{C21}/\overline{S_{C21}}$ to $S_{C2M}/\overline{S_{C2M}}$ may be considered part of the current mismatch measuring circuit, as described with reference to DACs 300 and 400. It shall be understood that the reference voltage $V_{REF}$, which is generated using $R_{sink}$ in FIG. 6, could be generated in other ways or be provided externally as its values would not impact the measurement.

The reference current source $I_{REF}$ is configured to generate a calibrated reference current $I_{REF}$, which is applied to a first input of the current summer 662. The reference current source $I_{REF}$ may also be configured as a PMOS FET with gate coupled to the gates of the PMOS FETs $I_{U11}$ to $I_{U1N}$, and M and $I_{U21}$ to $I_{U2M}$ of the differential binary and unary current-generating sections 610 and 620, respectively. As previously discussed, during current mismatch measurement, the differential binary current-generating section 610 is operated to generate a current $I_{MASTER}$, which is applied to a second input of the current summer 662 via a calibration resistor $R_{CAL}$. During this unary current mismatch measurement mode, the calibration complementary switches $S_{C11}/\overline{S_{C11}}$ to $S_{C1N}/\overline{S_{C1N}}$ are operated such that all are in the open/closed state. This directs the currents generated by the current sources $I_{U11}$ to $I_{U1N}$ to the differential R2R network 615 based on the control for complementary switches $S_{11}/\overline{S_{11}}$ to $S_{1N}/\overline{S_{1N}}$, respectively. The resistor $R_{CAL}$ is an exemplary implementation of the scaling device 463 in FIG. 4. The current summer 662 sums the reference current $I_{REF}$ with the current $I_{MASTER}$ from the differential binary current-generating section 610.

As discussed, the complementary calibration switches $\overline{S_{C21}}$ to $\overline{S_{C2M}}$ are coupled between the unary current sources $I_{U21}$ and to $I_{U2M}$ and the first input of the current subtractor 664, respectively. During unary current mismatch measurement mode, the complementary calibration switch corresponding to the selected current source is in the open/closed state, and the complementary calibration switches corresponding to the unselected current source are in the closed/open state. This directs only the current from the selected current source to the first input of the current subtractor 664. The current subtractor 664 is configured as a current mirror including a pair of NMOS FETs M1 and M2, with gates coupled together and sources coupled to ground. The drain of the NMOS FET M1 is coupled to the gates of both NMOS FETs M1 and M2. It shall be understood that the current subtractor 664 is merely one exemplary implementation, and may have a different implementation, such as a bipolar implementation, a cascoded mirror configuration, source-degenerated current mirror, etc.

The summed current $I_{REF}+I_{MASTER}$ generated by the current summer 662 is provided to a second input of the current subtractor 664 (e.g., to the drain of the NMOS FET M2). The current $I_{msb}$ from the selected unary current source of the unary current-generating section 620 is provided to the drain of the NMOS FET M1 via the corresponding calibration switch. Because of the current-mirror relationship of the NMOS FETs M1 and M2 of the current subtractor 664, the respective currents through the NMOS FETs M1 and M2 are substantially the same (assuming a mirror ratio of one (1)). Thus, to achieve this equality, the current subtractor 664 generates an error current $I_{ERROR}$ based on a difference between the current $I_{msb}$ and the summed current $I_{REE}+I_{MASTER}$ The error current $I_{ERROR}$ produces a voltage drop across the calibration resistor $R_{EAL}$, resulting in an error voltage $V_{ERROR}$ being applied to a positive input of the voltage comparator 666. The error voltage $V_{ERROR}$ is given by Vref*$(I_{msb}-(I_{REE}+I_{MASTER}))$ Note that the mirror ratio does not need to be one (1), and other ratio could be used in some applications.

The voltage comparator 666 compares the error voltage $V_{ERROR}$ to the reference voltage $V_{REF}$ from the differential R2R resistor network 615 applied across the resistor $R_{sink}$ at a negative input of the voltage comparator 666. If the error voltage $V_{ERROR}$ is below the threshold voltage Vref, the voltage comparator 666 generates a logic zero (0). If the error voltage $V_{ERROR}$ is above the threshold voltage Vref, the voltage comparator 666 generates a logic one (1). The logic output from the voltage comparator 666 is provided to the current mismatch controller (not shown).

As discussed in detail with reference to current-steering DAC 400, the current mismatch controller controls the current mismatch measurement and generates the complementary control signals for the switches of the differential binary current-generating section 610 and the switches of the differential unary current-generating section 620 pursuant to the unary current mismatch measurement. The final value of the differential binary current-generating section 610 provides the current mismatch associated with the selected current source of the unary current-generating section 620. Although the DAC 600 is exemplified as differential or current-steering DAC, it shall be understood that implementation is applicable (with alterations) to a single-ended DAC, such as current DAC 300.

As discussed, the current-steering DAC 600 further includes a set of calibration switches $S_{C11}$ to $S_{C1N}$ coupled between the current sources $I_{U11}$ to $I_{U1N}$ of the differential binary current-generation section 610 and the first input of the current subtractor 664, respectively. It may be desirable for calibration or other purposes to determine the difference between the currents generated by the current sources $I_{U11}$ to $I_{U1N}$ and the reference current $I_{REF}$. This again is referred to herein as the binary current mismatch measurement mode.

Pursuant to the binary current mismatch mode, the complementary calibration switches $S_{C21}/\overline{S_{C21}}$ to $S_{C2M}/\overline{S_{C2M}}$ of the unary current-generating section 620 are all in the closed/open state to electrically decouple or isolate the unary current sources $I_{U21}$ to $I_{U2M}$ from the first input of the current subtractor 664. Also, the complementary calibration switches corresponding to the selected current source of the binary current-generating section 610 is in the closed/open state, and the complementary calibration switches corresponding to the unselected current sources of the binary current-generating section 610 are in the open/closed state. This directs only the current from the selected binary current source to the first input of the current subtractor 664. In this measurement mode, the complementary switches $S_{11}/\overline{S_{11}}$ to $S_{1N}/\overline{S_{1N}}$ are all in the open/closed state to direct the current from the unselected binary current sources to the output VoutM, and away from the second input of the current summer 662. Thus, the $I_{master}$ in this mode is substantially nil.

In the binary current mismatch measurement mode, the output of the current subtractor 664 generates the error current $I_{ERROR}$ as a function of the difference or weighted-difference between the current $I_{msb}$ generated by the selected binary current source and the reference current $I_{REF}$, for use in calibration or other purpose, and may be applied to the input of the voltage comparator 666 or other device pursuant to the desired measurement.

It shall be understood that the described methods herein are applicable to non-classical R2R networks (such as segmented or splitter network). It shall also be understood that the current sources of the DACs previously described herein may be implemented using NMOS FETs. Additionally, it shall be understood that the unary current generation section and the binary current generation section may be segmented independently (e.g., the gates of the current-source FETs of the unary section need not be coupled to the gates of the current-source FETs of the binary section). In such case, the unit current ($I_U$) generated in the unary section may be different than the unit current ($I_U$) generated in the binary section.

With regard to the controllers described herein, a controller may be implemented as an application specific integrated circuit (ASIC), field programmable gate array (FPGA), part of a system on chip (SOC), digital signal processor (DSP), general purpose processor, microprocessor, microcontroller, etc. The hardware implementation of the controller may perform its operations under the control of instructions stored in a memory, such as a non-volatile memory (e.g., read only memory (ROM) and its permutations, such as programmable read only memory (PROM) and electrically erasable and programmable read only memory (EEPROM), magnetic hard disk, optical storage disk, etc.), and/or volatile memory, such as random access memory (RAM), cache memory, etc.

Figure 7:
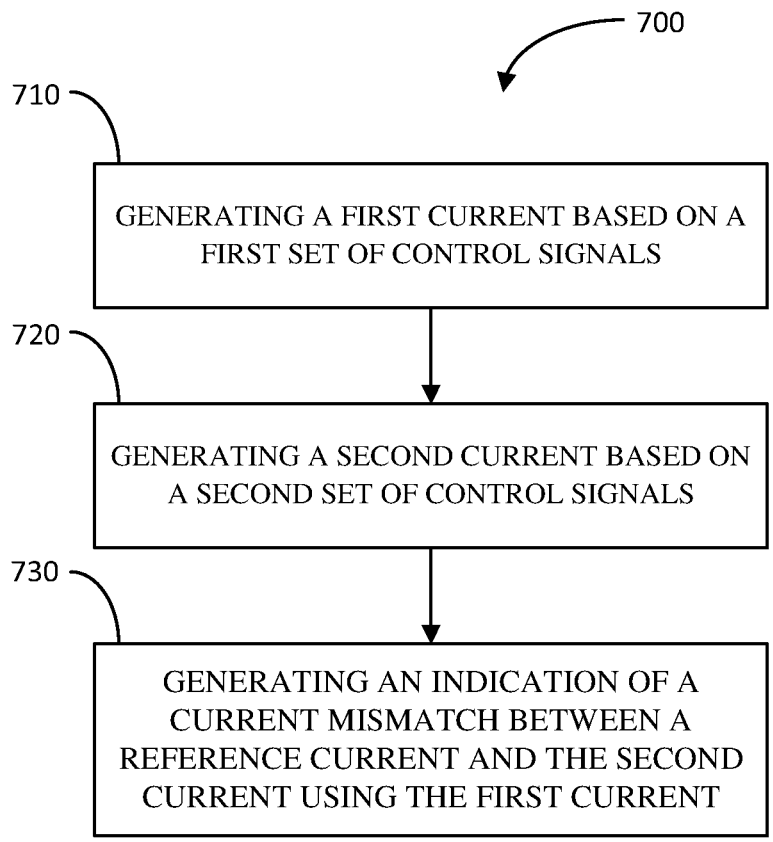
FIG. 7 illustrates a flow diagram of an exemplary method of measuring current mismatch in accordance with another aspect of the disclosure.

FIG. 7 illustrates a flow diagram of an exemplary method 700 of measuring current mismatch in accordance with another aspect of the disclosure. The method 700 may be implemented in current DAC 300 and current-steering DACs 400, 500, and 600 described herein.

The method 700 includes generating a first current based on a first set of control signals (block 710). Examples of means for generating a first current based on a first set of control signals include binary-weighted current-generating sections 310, 410, 510, and 610, where the first set of control signals are $b_1$ to $b_N$ in the case of binary-weighted current-generating section 310, and $b_1/\overline{b_1}$ to $b_N/\overline{b_N}$ in the case of binary-weighted current-generating sections 410, 510, and 610. The first current is the binary-weighted current generated by the binary-weighted current-generating sections 310, 410, 510, and 610.

The method 700 further includes generating a second current based on a second set of control signals (block 720). Examples of means for generating a second current based on a second set of control signals include unary-weighted current-generating sections 320, 420, 520, and 620, where the second set of control signals are $t_1$ to $t_M$ in the case of unary-weighted current-generating section 320, and $t_1/\overline{t_1}$ to $t_M/\overline{t_M}$ in the case of unary-weighted current-generating sections 420, 520, and 620. The second current is the unary-weighted current generated by the unary-weighted current-generating sections 320, 420, 520, and 620.

The method 700 additionally includes generating an indication of a current mismatch between a reference current and the second current using the first current (block 730). Examples of means for generating an indication of a current mismatch between a reference current and the second current using the first current include the controllers 368, 468, and those associated (but not shown) with current-steering DACs 500-600, wherein the value of the first set of control signals $b_1$ to $b_N$ or $b_1/\overline{b_1}$ to $b_N/\overline{b_N}$ provides an indication of the current mismatch between the reference current $I_{REF}$ and the second current by the unary-weighted current generating section during calibration.

Figure 8:
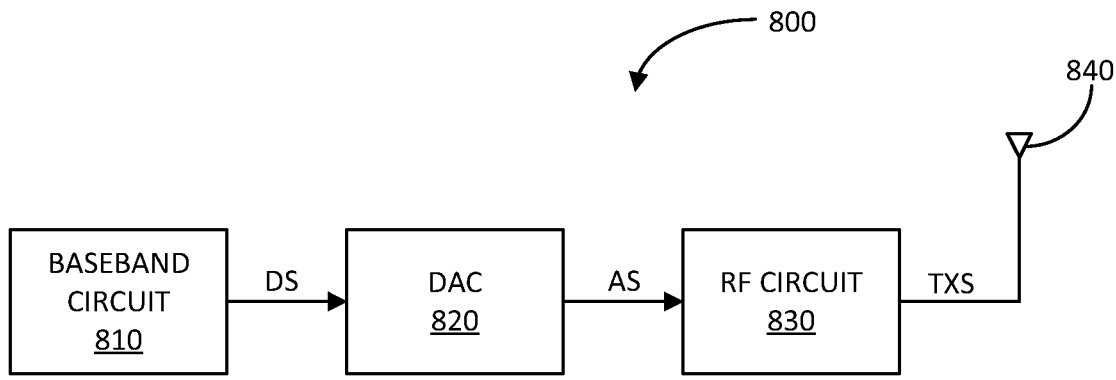
FIG. 8 illustrates a block diagram of an exemplary wireless device in accordance with another aspect of the disclosure.

FIG. 8 illustrates a block diagram of an exemplary wireless device 800 in accordance with another aspect of the disclosure. The wireless device 800 may be configured into any type of wireless device, such as a smart phone, laptop or desktop computer, pad device, and others. Further, in accordance with this example, the wireless device 800 includes a baseband circuit 810, a DAC 820, a radio frequency (RF) circuit 830, and at least one antenna 840. Accordingly, the signal transmit-side or transmitter of the wireless device 800 is illustrated. It shall be understood that the wireless device 800 may include other components, such as those associated with a receive-side or receiver of the wireless device 800.

The baseband circuit 810 is configured to generate a digital signal (DS). The DAC 820 is configured to convert the digital signal (DS) into an analog signal (AS). The DAC 820 may be configured into any of the DACs described herein, such as current DAC 300, and current-steering DACs 400, 500, and 600. The RF circuit 830 is configured to generate a transmit RF signal (TXS) based on the analog signal AS from the DAC 820, and may perform such operations as frequency upconverting, filtering, phase shifting, amplitude adjustment, power amplification, etc. The transmit signal (TXS) is provided to the at least one antenna 840 for wireless transmission to one or more remote devices.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus for measuring current mismatch, comprising:
a current digital-to-analog converter (DAC) configured to convert an input digital signal into an output analog current, comprising:
a first current-generating section configured to generate a first current based on a first set of control signals;
a second current-generating section configured to generate a second current based on a second set of control signals, wherein the first and second currents are summed to generate the output analog current;
a current combining circuit configured to add or subtract a reference current and a current generated by a current source of the second current-generating section using the first current; and
a comparator coupled to the current combining circuit and to the first current-generating section.

2. The apparatus of claim 1, wherein the first current-generating section comprises an R2R resistor network, wherein the first current is generated at a node of the R2R resistor network.

3. The apparatus of claim 2, wherein the current combining circuit comprises a scaling device configured to scale the first current, wherein the current combining circuit is configured to add or subtract the reference current and the current generated by the current source using the scaled first current.

4. The apparatus of claim 3, wherein the scaling device comprises a resistor.

5. The apparatus of claim 3, wherein the comparator is configured to compare an output current or output voltage generated by the current combining circuit with a reference voltage.

6. The apparatus of claim 5, wherein the comparator includes a first input coupled to the current combining circuit and a second input configured to receive the reference voltage and coupled to a resistor.

7. The apparatus of claim 1, wherein the first current-generating section comprises:
a set of current sources configured to generate a set of currents; and
an R2R resistor network configured to generate the first current based on one or more of the set of current sources.

8. The apparatus of claim 7, wherein the current combining circuit comprises a first resistor configured to scale the first current, wherein the current combining circuit is configured to add or subtract the reference current and the current generated by the current source using the scaled first current.

9. The apparatus of claim 8, wherein the comparator includes a first input coupled to the current combining circuit and a second input coupled to a second resistor.

10. The apparatus of claim 1, wherein the first current comprises a binary-weighted current, and wherein the second current comprises unary-weighted current.

11. The apparatus of claim 1, wherein the first current-generating section and the second current-generating section are single-ended or differential current-generating sections, respectively.

12. The apparatus of claim 1, wherein the current combining circuit comprises a current summer configured to generate a third current based on a sum of the first current with the reference current.

13. The apparatus of claim 12, wherein the current combining circuit further comprises a current subtractor configured to generate a fourth current based on a difference between the current from the current source and the third current.

14. The apparatus of claim 13, wherein the current subtractor comprises a current mirror including a first input configured to receive the current from the current source and a second input configured to receive the third current.

15. The apparatus of claim 13, wherein the current combining circuit further comprises a current comparator configured to generate a signal based on a comparison of the fourth current with a threshold.

16. The apparatus of claim 13, wherein the current combining circuit further comprises a controller configured to generate the first set of control signals to adjust the first current to decrease the fourth current to substantially nil.

17. The apparatus of claim 16, wherein a value of the first set of control signals when the fourth current is substantially nil provides an indication of a mismatch between the reference current and the current generated by the current source.

18. The apparatus of claim 1, wherein the current combining circuit is configured to measure a current mismatch between the reference current and another current generated by another current source of the first current-generating section.

19. The apparatus of claim 1, wherein the second current-generating section comprises a set of current sources including the current source, and further comprising a controller configured to adjust the current source based on a current mismatch between the current generated by the current source and the reference current.

20. The apparatus of claim 1, wherein the first current-generating section comprises an R2R network, wherein the comparator includes an input coupled to a node within the R2R network.

21. The apparatus of claim 1, further comprising a buffer, wherein the first current-generating section comprises an R2R network, and wherein the comparator includes an input coupled to a node within the R2R network via the buffer.

22. The apparatus of claim 1, wherein the first current-generating section comprises an R2R resistor network, wherein the first current is generated at a node of the R2R resistor network, wherein the comparator includes a first input coupled to the current combining circuit and a second input configured to receive a reference voltage and coupled to a resistor.

23. The apparatus of claim 1, wherein:
the first current-generating section is configured to generate the first current based on the first set of control signals in a first mode or a second mode;
the second current-generating section is configured to generate the second current based on the second set of control signals in the first mode or the second mode, wherein the first and second currents are summed to generate the output analog current in the first mode; and
the current combining circuit configured to add or subtract a reference current and the current generated by the current source of the second current-generating section using the first current in the second mode.

24. A digital-to-analog converter circuit for converting an input digital signal to an output analog current, comprising:
a first section configured to generate a first, comprising:
a first set of current sources configured to generate a first set of one or more currents, respectively; and
one or more resistive networks configured to generate the first current based on the first set of one or more currents;
a second section configured to generate a second current, wherein the second section comprises a second set of current sources, wherein the first and second currents are summed to generate the output analog current in response to the input digital signal; and
a measurement circuit operably coupled to the first section and the second.

25. The digital-to-analog converter circuit of claim 24, wherein the measurement circuit is configured to output a signal indicative of an amount of current mismatch between a reference current and the second current from at least one of the second set of current sources.

26. The digital-to-analog converter circuit of claim 24, wherein the first section is a binary current-generating section, wherein the second section is a unary current-generating section.

27. The digital-to-analog converter circuit of claim 24, wherein each of the one or more resistive networks is an R2R network.

28. The digital-to-analog converter circuit of claim 24, wherein the measurement circuit is configured to receive the second current from at least one of the second set of current sources.

29. The digital-to-analog converter circuit of claim 24, wherein the measurement circuit is configured to compare the second current from the at least one of the second set of current sources to the first current generated at least in part from the first section.

30. The digital-to-analog converter circuit of claim 29, wherein the measurement circuit is configured to control one or more switches of the first section to decrease a difference between the second current from the at least one of the second set of current sources and the first current provided by the first section.

31. The digital-to-analog converter circuit of claim 24, wherein:
the first section is configured to generate the first current in a first mode or a second mode;
the second section is configured to generate the second current in the first mode or the second mode; and
the measurement circuit is operably coupled to the first section and the second section in the second mode.

32. A method of measuring current mismatch, comprising:
generating a first current based on a first set of control signals in response to an input digital signal or a measurement mode;
generating a second current based on a second set of control signals in response to an input digital signal or a measurement mode, wherein the first and second currents are summed to generate an output analog current in response to the input digital signal; and
generating an indication of a current mismatch between a reference current and the second current using the first current in response to the measurement mode.

33. The method of claim 32, wherein the indication is a value of the first set of control signals when a difference between the second current and a sum of the first and reference currents is a defined value.

34. An apparatus for measuring current mismatch, comprising:
means for generating a first current based on a first set of control signals;
means for generating a second current based on a second set of control signals, wherein the first and second currents are summed to generate an output analog current; and
means for generating an indication of a current mismatch between a reference current and the second current using the first current.

35. The apparatus of claim 34, wherein:
the means for generating the first current comprises means for generating the first current in a first mode or a second mode;
the means for generating the second current comprises means for generating the second current in the first mode or the second mode; and
the means for generating the indication of the current mismatch comprises means for generating the indication of the current mismatch in the second mode.

* * * * *